United States Patent
Fontana

[19]

[11] Patent Number: 5,859,767
[45] Date of Patent: Jan. 12, 1999

[54] ELECTRONICS CHASSIS AND METHOD OF MANUFACTURING AND OPERATING THEREOF

[75] Inventor: Edward C. Fontana, Rockwall, Tex.

[73] Assignee: Lucent Technologies Inc., Murray Hill, N.J.

[21] Appl. No.: 847,209

[22] Filed: May 1, 1997

[51] Int. Cl.⁶ .................................................. H05K 9/00
[52] U.S. Cl. .................... 361/818; 361/818; 361/816; 361/800; 361/683; 361/679; 174/35 R; 174/35 MS; 174/51; 174/35 GC; 174/66
[58] Field of Search .................... 361/818, 816, 361/800, 690, 683, 796, 801, 75, 754, 679; 174/35 R, 35 MS, 51, 35 GC, 66

[56] References Cited

U.S. PATENT DOCUMENTS

| | | | |
|---|---|---|---|
| 5,223,670 | 6/1993 | Hogan et al. | 174/35 MS |
| 5,262,588 | 11/1993 | Gallagher | 174/35 R |
| 5,561,893 | 10/1996 | Lee | 29/434 |
| 5,691,503 | 11/1997 | Kato | 174/35 R |
| 5,691,504 | 11/1997 | Sands et al. | 174/35 R |
| 5,701,231 | 12/1997 | Do et al. | 361/683 |
| 5,726,684 | 3/1998 | Copeland et al. | 361/800 |

*Primary Examiner*—Leo P. Picard
*Assistant Examiner*—David Foster

[57] ABSTRACT

A chassis for containing electromagnetic interference ("EMI")-generating equipment and methods of operation and manufacturing thereof. The chassis includes: (1) a cabinet having a base wall, the base wall having hinge race slots located along a forward edge thereof, lances between the hinge race slots and the forward edge forming hinge pins and (2) a door having arcuate hinge races extending from a hinge edge thereof and through corresponding ones of the hinge race slots to cooperate with the hinge pins to form hinges for the door. The hinge races have locking tabs extending laterally therefrom. The locking tabs have bent portions preventing the hinge races from being withdrawn from the hinge race slots.

14 Claims, 4 Drawing Sheets

ELECTRONICS CHASSIS AND METHOD OF MANUFACTURING AND OPERATING THEREOF

TECHNICAL FIELD OF THE INVENTION

The present invention is directed, in general, to an electronics chassis, and more particularly to an electronics chassis for containing electronic equipment that generates electromagnetic interference ("EMI") and methods of manufacture and operation thereof.

BACKGROUND OF THE INVENTION

It has become customary to house electronic equipment, such as telecommunications equipment, in electronics chassis. Frequently, such chassis are designed to be rack-mountable to provide efficient storage for large quantities of equipment. In places where such is large quantities of equipment are operated, space is typically at a premium. Accordingly, customers of chassis and racks are sensitive about devoting space to other than the equipment itself.

One type of chassis commonly encountered in rack-mountable form provides a means by which electrically to interconnect and cool equipment divided into modules and located in bays within the chassis. Such chassis are characterized by a rear cabinet and a hinged door on a front side thereof that can be opened to gain access to the modular equipment housed therein and closed to protect the modular equipment or to improve the cooling or appearance thereof.

It is necessary to provide a hinge for such doors that meets several, sometimes conflicting, requirements. First, the hinge should not add to the overall height of the chassis so as not to increase the overall height of the rack. Second, the hinge should not compromise the safety or structural integrity of the chassis as a whole; it should be able to withstand years of use. Third, the hinge structure should not impede the use of conventional equipment modules. In other words, the hinge should not protrude into the bays so as to interfere with the insertion or removal of equipment modules. Fourth, the hinge must not allow substantial EMI to escape from the chassis. Given the higher operating frequencies of today's telecommunications equipment, it is necessary to insure that long gaps that would allow radiation to escape from the chassis are not allowed to exist therein. Fifth, the hinge should not unduly add to the cost (material or labor) of manufacturing the chassis. Sixth, the hinge structure should not interfere with the serviceability of the chassis itself, apart from the equipment modules that may be located therein. Seventh, the hinge structure should not detract from the appearance of the front of the chassis. Eighth, the hinge structure should discourage significant amounts of air from passing into or out of the chassis around the door. As stated above, such chassis are frequently provided with a central cooling, requiring a defined flow for cooling air to be established through the chassis. Were the hinge structure to interfere with this flow by introducing an undesired inlet or outlet, the overall cooling capacity of the chassis could be compromised.

Finally, it is most desirable that the door be joined to the cabinet as a last step during manufacture thereof. The door usually is the most visible portion of the chassis and accordingly frequently contains graphics and other attractive designs that, were the door subjected to a larger part of the manufacturing process, could be damaged.

The obvious solution, and commensurate with that found in the prior art, is to provide a piano hinge that runs the length of the door. However, some chassis designs provide slots in the door to allow the equipment modules within the chassis to be viewed or contacted from without the chassis when the door is closed. The presence of the slots requires a piano hinge to be separated into many short lengths.

Some equipment modules require latches to engage and extract the modules from the backplane. To conserve space efficiencies, the latches are located low on the modules. Discontinuities must be introduced into a piano hinge to allow the latches to pass the hinge when the equipment modules are inserted into or removed from the chassis. Whether viewability or latch clearance is the issue in a given application, fabricating a discontinuous hinge to accommodate either can be quite difficult and expensive.

A less expensive solution is to eliminate the short lengths of piano hinge except for those at the extreme ends of the door. While this reduces somewhat the cost of manufacturing the chassis, the short lengths of piano hinge necessarily have long gaps therebetween that can admit or release EMI, degrading the electromagnetic performance of the chassis as a whole.

Therefore, what is needed in the art is a lower cost, more effective way of hinging a door to a cabinet to form an electronic chassis.

SUMMARY OF THE INVENTION

Accordingly, to address the above-described deficiencies of the prior art, the present invention provides a chassis for containing EMI-generating equipment, including: (1) a cabinet having a base wall, the base wall having hinge race slots located along a forward edge thereof, lances between the hinge race slots and the forward edge forming hinge pins and (2) a door having arcuate hinge races extending from a hinge edge thereof and through corresponding ones of the hinge race slots to cooperate with the hinge pins to perform hinges for the door. The hinge races have locking tabs extending laterally therefrom. The locking tabs have a bent portion preventing the hinge races from being withdrawn from the hinge race slots.

The present invention therefore introduces a novel hinge mechanism employing locking tabs on the hinge races. When the locking tabs are bent, the hinge races are unable to pass through the hinge race slots and therefore cooperate to form a hinge for the door. The locking tabs may subsequently be unbent to allow the hinge races to be withdrawn from the hinge race slots, allowing the door to be removed from the cabinet.

In one embodiment of the present invention, the cabinet and the door are composed of metal, the hinges interrupting gaps between the forward edge and the hinge edge to attenuate the EMI. As described above, long gaps (on the order of several inches) between the door and the cabinet can act as a radiator, allow EMI to be admitted into or escape the chassis. The hinge structure described above can be employed to interrupt these gaps and prevent EMI from escaping.

In one embodiment of the present invention, the hinge edge of the door interferes with the base wall when the door achieves the desired maximum angle of rotation with respect to the base wall to prevent overrotation of the door.

In one embodiment of the present invention, the hinge pins are located without a plane of the base wall. In the embodiment to be illustrated and described, the lances are urged outward (downward, as viewed upright) with respect to the cabinet. This allows the hinge to be clear of any modules (or latches thereof) that are placed within the chassis. Of course, this need not be the case.

In one embodiment of the present invention, the bent portions are displaceable to allow the hinge races to be withdrawn from the hinge race slots.

In one embodiment of the present invention, the door cooperates with the equipment to form a barrier as against air flow through the door when the door is in a closed position with respect to the cabinet. In an embodiment to be illustrated and described, the door has slots in it that allow visual inspection of, or contact with, modules within the chassis without having to open the door. When modules occupy the chassis, the slots are substantially blocked. The hinge of the present invention further prevents an obstacle to air flow from under the door, thereby help to maintain the desired air flow path within the chassis.

In one embodiment of the present invention, the chassis further comprises a latch that secures the door in a closed position with respect to the cabinet. The latch may be released to allow the door to open, perhaps to its desired maximum angle of rotation with respect to the base wall.

The foregoing has outlined, rather broadly, preferred and alternative features of the present invention so that those skilled the art may better understand the detailed description of the invention that follows. Additional features of the invention will be described hereinafter that form the subject of the claims of the invention. Those skilled in the art should appreciate that they can readily use the disclosed conception and specific embodiment as a basis for designing or modifying other structures for carrying out the same purposes of the present invention. Those skilled in the art should also realize that such equivalent constructions do not depart from the spirit and scope of the invention in its broadest form.

BRIEF DESCRIPTION OF THE DRAWINGS

For a more complete understanding of the present invention, reference is now made to the following descriptions taken in conjunction with the accompanying drawings, in which.

DETAILED DESCRIPTION

Figure 1:
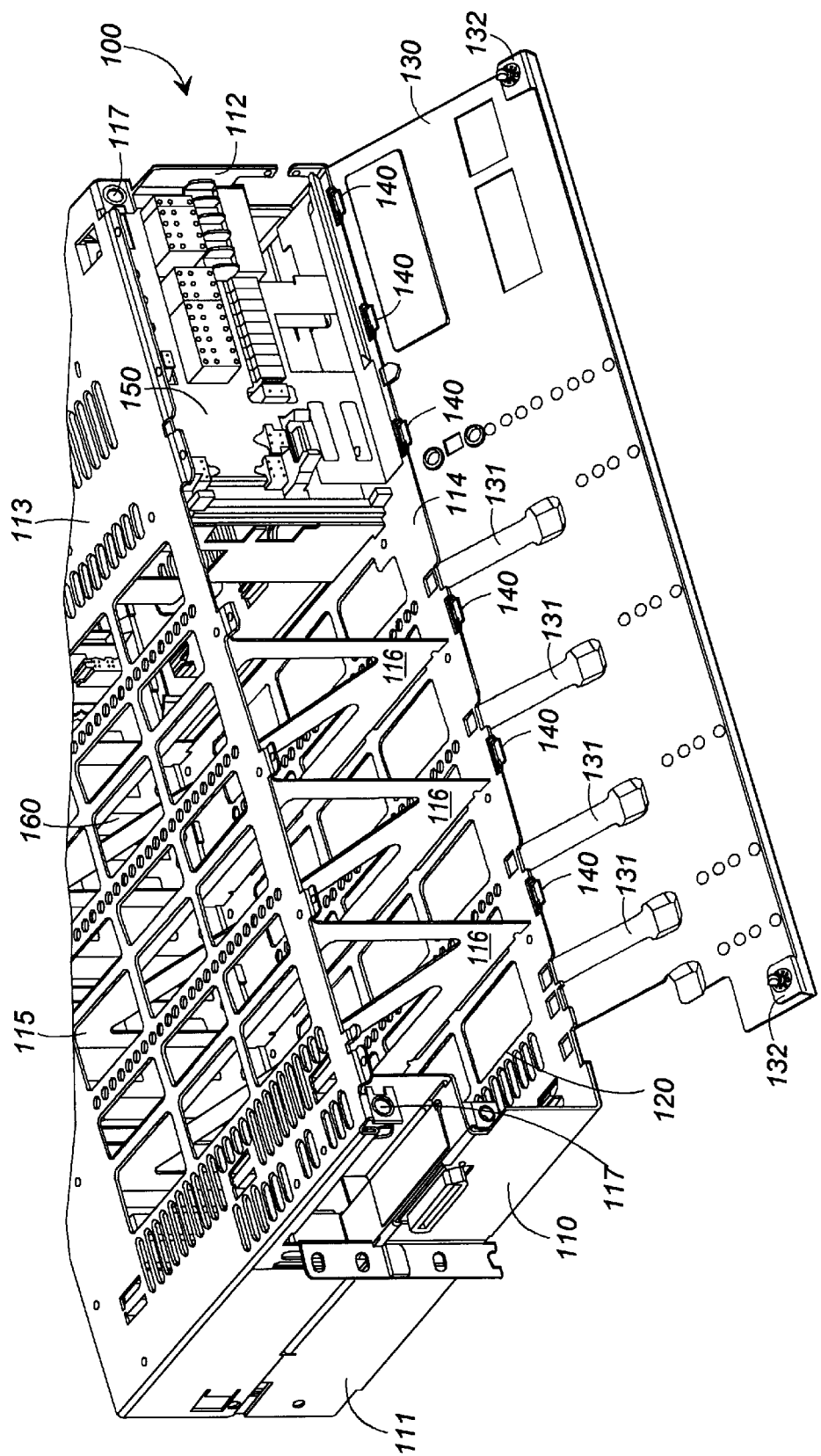
FIG. 1 illustrates a partial front side isometric view of one embodiment of the electronics chassis of the present invention.

Referring initially to FIG. 1, illustrated is a partial front side isometric view of one embodiment of the electronics chassis of the present invention. The electronics chassis, generally designated 100, comprises a cabinet 110 having a plurality of separate equipment module bays (one of which is referenced as 120) therein for receiving one or more equipment modules (not shown), such as telecommunications equipment. The cabinet 110 comprises sidewalls 111, 112, a top wall 113 and a base wall 114. Each of the top wall 113 and the bottom wall 114 is illustrated as having cooling ports, one of which is referenced as 115, formed therein. The cooling ports 115 allow a cooling fluid, commonly air, to pass through the cooling ports 115 of the bottom wall 114 and the top wall 113 (vertically, if the chassis is oriented as shown in FIG. 1). A plurality of dividers 116 define the equipment bays 120.

The chassis 100 further includes control circuitry 150 that may be employed, for example, to provide common control or power for any equipment modules that may be inserted into the chassis 100. The control circuitry is coupled to the equipment modules by a bus 160, which may take the physical form of a "backplane" on a rear wall of the cabinet 110.

A door 130 is also shown. The door 130 is hingedly coupled to the cabinet 110 via a plurality of hinge portions, generally designated 140, that cooperate to form a hinge for the door 130. As described above, the hinge portions 140 offer several advantageous features. First, the hinge portions 140 allow the door 130 to rotate only up to a desired maximum angle of rotation with respect to the base wall 114. Second, the hinge portions 140 are preferably flush with respect to the base wall 114, allowing the equipment modules (not shown) to be inserted into or removed from the base 120 without interfering with the hinge portions 140. This specific way in which this is accomplished will be described most particularly with reference to FIG. 4, below. Third, the hinge portions 140 provide a plurality of grounding points between the door 130 and the cabinet 120, interrupting gaps on the order of several inches that would, if present, radiate EMI from, or admit EMI into, the chassis 100. Further, the hinge portions 140 are preferably hidden by the door 130 when viewed from the front of the chassis 100 with the door 130 closed. This enhances the overall appearance of the chassis 100. Finally, it should be noted that the door 130 contains a plurality of vertical slots 131. Each of the plurality of slots 131 is adapted to allow the front bezels of modular equipment (not shown) located in the chassis 100 to be viewed or contacted from the front of the chassis 100 when the door 130 is in a closed position. The bezels on the front of the modular equipment cooperate where the remainder of the door 130 to restrict airflow through the vertical slots 131, ensuring that most airflow is realized by way of the cooling ports 115.

Finally, FIG. 1 shows a pair of latches 132 on left and right ends (as illustrated) of the door 130. The latches 132 mate with corresponding receptacles 117 in the cabinet 110 to allow the door 130 to be fixed in a closed position relative to the cabinet 110. It should be noted at this point that FIG. 1 is shown mainly for the purpose of illustrating an environment in which the present invention can operate. Because the present invention is directed to a hinge, the shape, composition and contents of the cabinet 110 or other features of the door 130 are completely unnecessary to the present invention.

Figure 2:
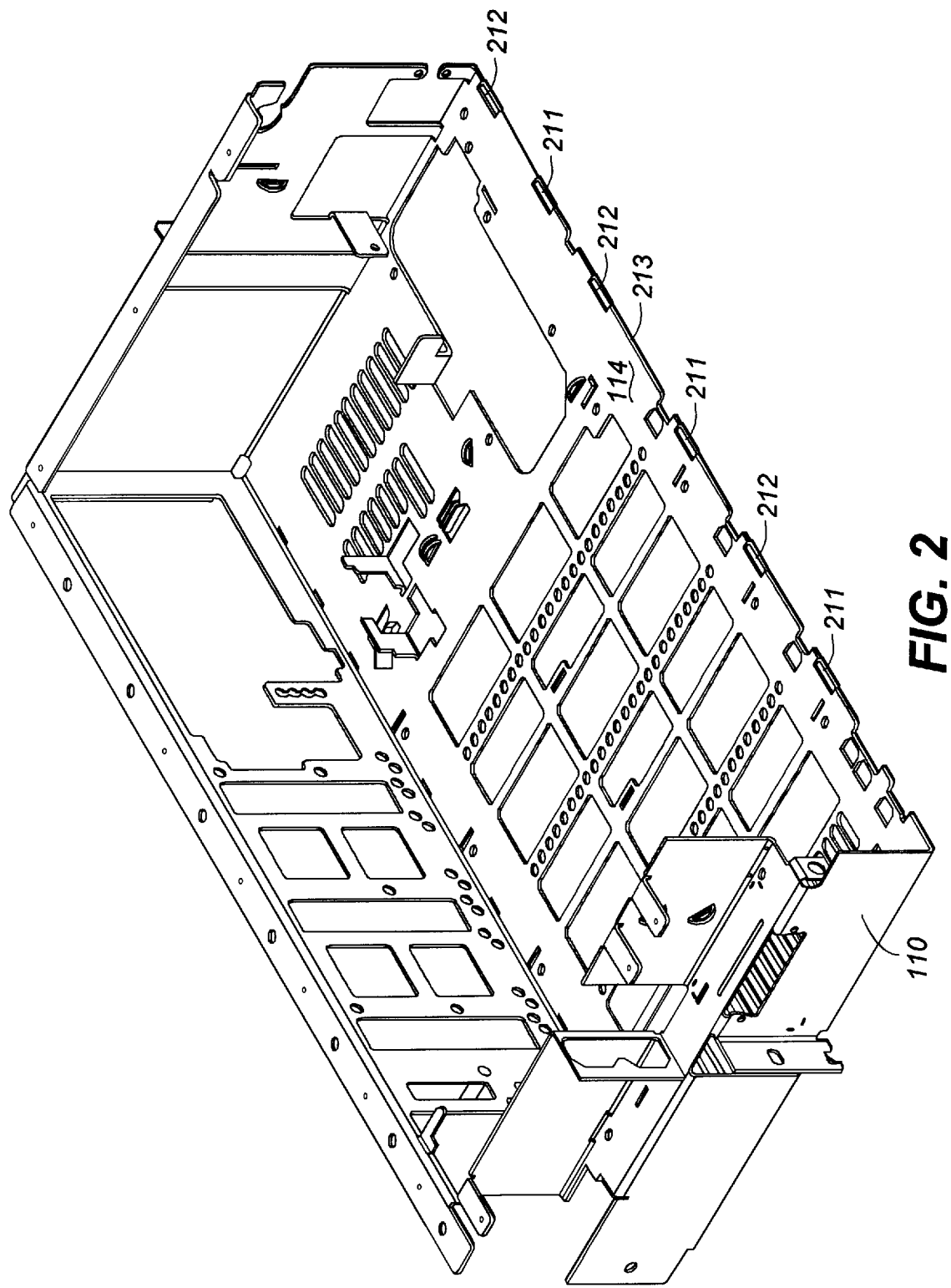
FIG. 2 illustrates a front side isometric view of the cabinet of FIG. 1.

Turning now to FIG. 2, illustrated is a front side isometric view of the cabinet 110 of FIG. 1, minus many other structural elements of the chassis 100, such as the dividers 116, that were illustrated in FIG. 1. FIG. 2 is included primarily for the purpose of illustrating the presence and relative relationship of a plurality of hinge race slots 211 and lances 212 located along a forward edge 213 of the cabinet 110. Conventionally, the cabinet 110 is manufactured by a stamping process, wherein ports, slots and breaks are formed in a flat sheet of metal to fabricate the cabinet 110. During this stamping process, the hinge race slots 211 and lances 212 may be formed without incurring additional manufacturing steps. Preferably, the lances 212 are formed outside of (offset from) the plane of the base wall 114 of the cabinet 110. The reason for this offset will be set forth in greatest detail in conjunction with a description of FIG. 4, below.

Figure 3:
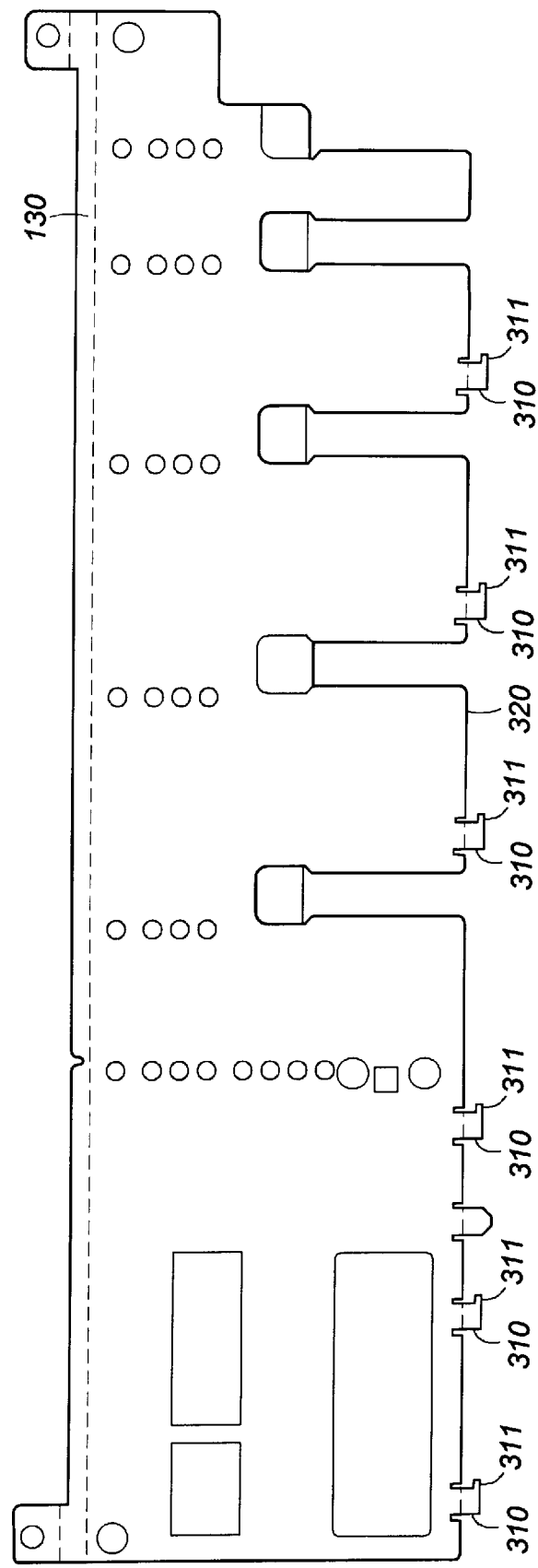
FIG. 3 illustrates a reverse-angle elevational view of the door of FIG. 1 in a flat form prior to bending.

Turning now to FIG. 3, illustrated is a reverse-angle elevational view of the door 130 of FIG. 1 in a flat form prior to bending. In other words, FIG. 3 illustrates an inner surface of the door 130. FIG. 3 is presented primarily for the purpose of showing details of the hinge races 310. The door 130 is illustrated as being initially stamped from a flat metal sheet. Following stamping, the hinge races 310 are bent into an arcuate shape. However, FIG. 3 shows the hinge races 310 before they have been so bent better to illustrate their shape. The hinge races 310 extend from a hinge edge 320 of the door 130 and are adapted to pass through corresponding ones of the hinge race slots 211 of FIG. 2 and thereafter to cooperate with the lances 212 (now acting as hinge pins) to form a hinge for the door 130. The hinge races 310 of FIG. 3 have locking tabs 311 extending laterally therefrom. The locking tabs 311 have bent portions (illustrated particularly in FIG. 4) that, when bent, prevent the hinge races 310 from being withdrawn from the hinge race slots 211 of FIG. 2.

Figure 4:
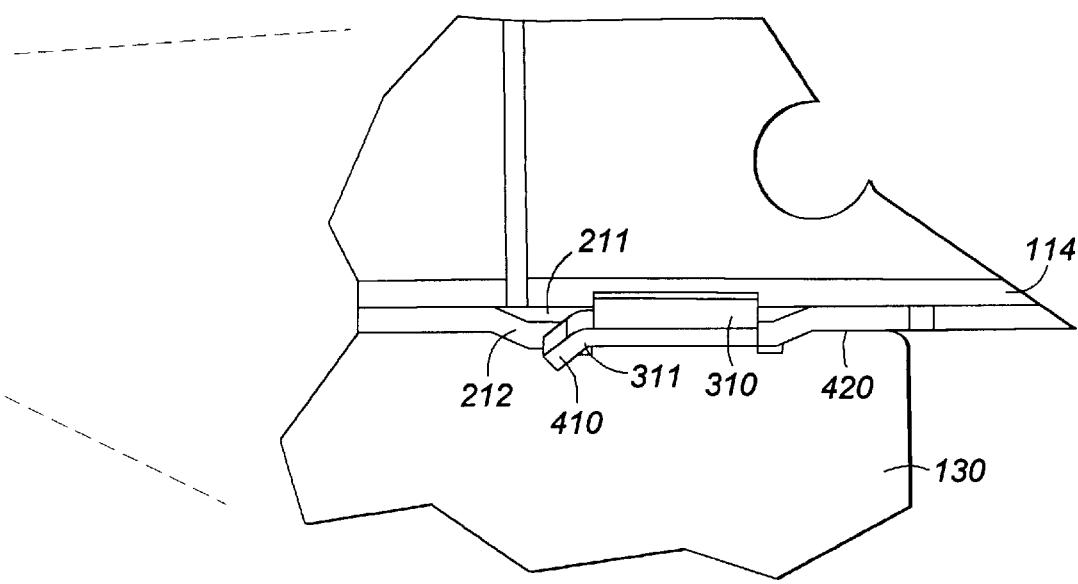
FIG. 4 illustrates a detailed cutaway elevational view of a single hinge portion constructed according to the present invention.

Turning now to FIG. 4, illustrated is a detailed cutaway elevational view of a single hinge portion constructed according to the present invention. Shown are the base wall 114 and door 130 of FIG. 1. Also shown are one each of the hinge race slots 211 and lances 212 (now acting as a hinge pin) of FIG. 2. Further shown are one each of the hinge races 310 and locking tabs 311 of FIG. 3. It can now be seen that the hinge race 310 is bent into an arcuate shape and extends through the hinge race slot 211. It can also be seen now that the locking tab 311 contains a bent portion 410. As the door 130 is rotated toward a fully open position, a hinge edge 420 of the door 130 rotates about and eventually comes into interference with the base wall 114 when the door 130 reaches a desired maximum angle of rotation with respect to the base wall 114. This prevents overrotation of the door 130 with respect to the base wall 114. The hinge edge 420 may be extended downward (as the door 130 is shown in FIG. 4) to decrease the desired maximum angle of rotation or may be reduced in length to increase the desired maximum angle of rotation.

It is further illustrated in FIG. 4 that the hinge race 310 does not extend above the plane of the base wall 114. This is because the lance 212 was formed below the plane of the base wall 114 by a distance at least equaling a thickness of the metal constituting the door 130. This ensures that the hinge portion does not interfere with the insertion or removal of equipment modules.

A method of manufacturing the chassis of the present invention may be as follows. First, the cabinet 110 is formed by means of a stamping process. Second, structures within the cabinet 110, such as dividers and an electrical backplane, may be added. Third, the door 130 is formed, preferably also by a stamping process. Fourth, the hinge races 310 are bent into an arcuate shape. (However, it is noted that the locking tabs 311 should remain unbent, allowing the hinge races 310 to be inserted through the hinge race slots 211.) Next, the hinge races 310 are inserted through the hinge race slots 211. The locking tabs 311 are then bent with respect to the remainder of the hinge races 310. This may be done by means of twisting by, for instance, conventional needlenose pliers. This forms the bent portion 410 illustrated most clearly in FIG. 4.

Creating a bent portion 410 in each hinge race 310 causes the hinge races 310 to resist being withdrawn from the hinge race slots 211, thereby preventing the door 130 from being separated from the base wall 114. Further, the hinge edge 420 of the door 130 is brought into alignment with the base wall 114, causing them to act as overrotation limits to prevent the door 130 from exceeding a desired maximum angle of rotation with respect to the base wall 114.

From the above, it is apparent that the present invention provides a chassis for containing EMI-generating equipment. The chassis comprises: (1) a cabinet having a base wall, the base wall having hinge race slots located along a forward edge thereof, lances between the hinge race slots and the forward edge forming hinge bends and (2) a door having arcuate hinge races extending from a hinge edge thereof and through corresponding ones of the hinge race slots to cooperate with the hinge pins to form hinges for the door. The hinge races have locking tabs extending laterally therefrom. The locking tabs have bent portions preventing the hinge races from being withdrawn from the hinge race slots.

Although the present invention has been described in detail, those skilled in the art should understand that they can make various changes, substitutions and alterations herein without departing from the spirit and scope of the invention in its broadest form.

What is claimed is:

1. A chassis for containing electromagnetic interference (EMI)-generating equipment, comprising:

a cabinet having a base wall, said base wall having hinge race slots located along a forward edge thereof, lances between said hinge race slots and said forward edge forming hinge pins; and a door having arcuate hinge races extending from a hinge edge thereof and through corresponding ones of said hinge race slots to cooperate with said hinge pins to form hinges for said door, said hinge races having locking tabs extending laterally therefrom, said locking tabs having bent portions preventing said hinge races from being withdrawn from said hinge race slots.

2. The chassis as recited in claim 1 wherein said cabinet and said door are composed of metal, said hinges interrupting gaps between said forward edge and said hinge edge to attenuate said EMI.

3. The chassis as recited in claim 1 wherein said hinge edge of said door interferes with said base wall when said door achieves a desired maximum angle of rotation with respect to said base wall to prevent overrotation of said door.

4. The chassis as recited in claim 1 wherein said hinge pins are located without a plane of said base wall.

5. The chassis as recited in claim 1 wherein said bent portions are displaceable to allow said hinge races to be withdrawn from said hinge race slots.

6. The chassis as recited in claim 1 wherein said door cooperates with said equipment to form a barrier as against airflow through said door when said door is in a closed position with respect to said cabinet.

7. The chassis as recited in claim 1 further comprising a latch, coupled to said door and said cabinet, that secures said door in a closed position with respect to said cabinet.

8. A chassis for containing electromagnetic interference (EMI)-generating equipment modules, comprising:

a cabinet having a base wall, said base wall having hinge race slots located along a forward edge thereof, lances between said hinge race slots and said forward edge forming hinge pins;

control circuitry, located within said cabinet, that provides common control for said equipment modules;

a bus, located within said cabinet and coupled to said control circuitry, that communicates signals between said control circuitry and said equipment modules; and a door having arcuate hinge races extending from a hinge edge thereof and through corresponding ones of said hinge race slots to cooperate with said hinge pins to form hinges for said door, said hinge races having locking tabs extending laterally therefrom, said locking tabs having bent portions preventing said hinge races from being withdrawn from said hinge race slots, said locking tabs further interfering with said hinge pins when said door achieves a desired maximum angle of rotation with respect to said base wall to prevent overrotation of said door.

9. The chassis as recited in claim 8 wherein said cabinet and said door are composed of metal, said hinges interrupting gaps between said forward edge and said hinge edge to attenuate said EMI.

10. The chassis as recited in claim 8 wherein said hinge edge of said door interferes with said base wall when said door achieves a desired maximum angle of rotation with respect to said base wall to prevent overrotation of said door.

11. The chassis as recited in claim 8 wherein said hinge pins are located without a plane of said base wall.

12. The chassis as recited in claim 8 wherein said bent portions are displaceable to allow said hinge races to be withdrawn from said hinge race slots.

13. The chassis as recited in claim 8 wherein said door cooperates with said equipment to form a barrier as against airflow through said door when said door is in a closed position with respect to said cabinet.

14. The chassis as recited in claim 8 further comprising a latch, coupled to said door and said cabinet, that secures said door in a closed position with respect to said cabinet.

\* \* \* \* \*